United States Patent
Merriman et al.

(10) Patent No.: US 12,086,830 B2
(45) Date of Patent: Sep. 10, 2024

(54) SYSTEMS AND METHODS FOR LEVERAGING SOCIAL QUEUING TO SIMULATE TICKET PURCHASER BEHAVIOR

(71) Applicant: Live Nation Entertainment, Inc., Beverly Hills, CA (US)

(72) Inventors: Callum Merriman, Brooklyn, NY (US); Joshua C. Block, Brooklyn, NY (US)

(73) Assignee: Live Nation Entertainment, Inc., Beverly Hills, CA (US)

(*) Notice: Subject to any disclaimer, the term of this patent is extended or adjusted under 35 U.S.C. 154(b) by 0 days.

(21) Appl. No.: 18/299,633

(22) Filed: Apr. 12, 2023

(65) Prior Publication Data

US 2023/0325878 A1    Oct. 12, 2023

Related U.S. Application Data

(63) Continuation of application No. 17/000,562, filed on Aug. 24, 2020, now Pat. No. 11,657,427, which is a continuation of application No. 16/160,836, filed on Oct. 15, 2018, now Pat. No. 10,755,307, which is a continuation of application No. 14/595,886, filed on Jan. 13, 2015, now Pat. No. 10,102,544.

(51) Int. Cl.
*G06Q 30/0251* (2023.01)
*G06F 30/20* (2020.01)

(52) U.S. Cl.
CPC ......... *G06Q 30/0255* (2013.01); *G06F 30/20* (2020.01)

(58) Field of Classification Search
CPC ............................ G06Q 30/0255; G06F 30/20
See application file for complete search history.

(56) References Cited

U.S. PATENT DOCUMENTS

| | | | |
|---|---|---|---|
| 2002/0010620 A1* | 1/2002 | Kowalchuk | G06Q 30/0204 705/7.33 |
| 2007/0055554 A1* | 3/2007 | Sussman | G06Q 10/06 705/5 |
| 2009/0199296 A1* | 8/2009 | Xie | G06F 21/316 726/23 |

FOREIGN PATENT DOCUMENTS

WO    WO-2013152311 A1 *  10/2013  ......... G06F 16/2455

* cited by examiner

*Primary Examiner* — Sonji N Johnson
(74) *Attorney, Agent, or Firm* — MUGHAL GAUDRY & FRANKLIN PC

(57) ABSTRACT

A method for simulating a social media account history may be provided. The method may include generating social media identification information ("social media ID"). The method may also include creating an account history for the social media ID with respect to a pre-determined entity. The creating may include identifying the social media ID with respect to at least one of a time-stamped indication of affinity for the predetermined entity. The creating may also include tagging of a photograph of the entity. The creating may also include linking of a photograph of the pre-determined entity. The creating may also include a threshold amount of streaming audio time relating to the predetermined entity. The method may also include querying the account history to determine whether the account history includes one or more parameters that indicate whether the social media ID information is related to an automated entity or a human entity.

20 Claims, 8 Drawing Sheets

SYSTEMS AND METHODS FOR LEVERAGING SOCIAL QUEUING TO SIMULATE TICKET PURCHASER BEHAVIOR

CLAIM FOR PRIORITY

This application is a continuation of U.S. application Ser. No. 17/000,562, filed Aug. 24, 2020, which is a continuation of U.S. application Ser. No. 16/160,836, filed Oct. 15, 2018, now U.S. Pat. No. 10,755,307, issued Aug. 25, 2020, which is a continuation of U.S. application Ser. No. 14/595,886, filed Jan. 13, 2015, now U.S. Pat. No. 10,102,544, issued Oct. 16, 2018, the disclosures of each of which are incorporated herein by reference in their entirety for all purposes.

FIELD OF TECHNOLOGY

The disclosure relates to prioritizing potential event ticket purchasers. This disclosure also relates to simulating, identifying and/or searching for potential event ticket purchaser behavior.

BACKGROUND OF THE INVENTION

Currently, ticket resellers utilize automated software for purchasing tickets. Such automated software may, in turn, utilize application programming interface(s) ("API(s)") to access event ticket purchasing websites. These APis typically are supported by one or more computers.

APis are to software and/or hardware information systems as plug and socket designs are to appliances, such as lamps. More specifically, APis allows software and/or hardware information systems to interoperate with other systems and/or programs, in a way similar to the way that plugs and sockets allow lamps to operate with the electrical grid. Just as a plug conforms to the contours of a socket in order for electricity to flow to allow the lamp to operate, so to a computer program designed to be compatible with another program should preferably conform to the API of the first program. In other words, the API of the first program may establish rules about how other programs can send and receive information so that the two programs can work together to execute specific tasks.

Programs for selling event tickets are typically designed for human interaction—i.e., these programs are designed to be used by human ticket purchasers. However, ticket resellers have created applications with automated software that utilizes APis designed to interact with the programs for selling event tickets. Such applications, and APis associated therewith, may enjoy an unfair advantage over human ticket purchasers. The unfair advantage may result, at least in part, because the reaction time of the applications created by resellers, is typically less than the reaction time of human ticket purchasers, and the volume of ticket purchasing attempts made by resellers is typically more than the volume of attempts made by human ticket purchasers. Nevertheless, such applications typically exhibit automated computer-like behavior.

It would be desirable to provide event ticket systems and methods that reduce the unfair advantage in ticket purchases enjoyed by automated ticket purchasing software and associated APis.

BRIEF SUMMARY OF THE INVENTION

Certain embodiments may include an event ticket distribution system. The system may include a receiver configured to receive a plurality of logins.

Each of the logins may be intended for an event ticket purchase. Each of the logins may include, or be associated with, social media identification information ("social media ID"). In certain embodiments, more than one login may be associated with a single user to allow systems and methods according to the invention to retrieve account history from a number of different of social media sites associated with the user.

The system may include a processor configured to retrieve account history associated with the social media ID. The processor may be further configured to calculate an index value associated with the social media ID. The index value may be based, at least in part, on the retrieved account history.

When the index value associated with a login is above a pre-determined threshold value, the processor may be further configured to assign a priority flag to the login. The priority flag may enable a preferably real-time event ticket purchase not available in real-time, or, in certain embodiments, not available at all, to a non-flagged login. It should be noted that, to obtain priority treatment on a login to purchase tickets, the purchaser should, at least in some embodiments, pre-register in order to have their requested ticket purchase be qualified as a priority purchase. In such circumstances, the purchaser may receive priority ticket purchase opportunities in real-time, whereas such real-time ticket purchase opportunities may not be available to a non-flagged login. It should be noted that, in certain embodiments, the pre-registration step preferably provides time to retrieve and analyze a user's social media history. Such analysis may preferably provide a detailed understanding of the relative "value" of the user to the performing entity. In certain embodiments, such a value determination may preferably dictate a timed (where users are allotted prioritized times), staggered (where users receive ordered times relative to one another), windowed (where users are provided time windows) or other suitably configured system for interacting with, searching for, and/or purchasing of tickets.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
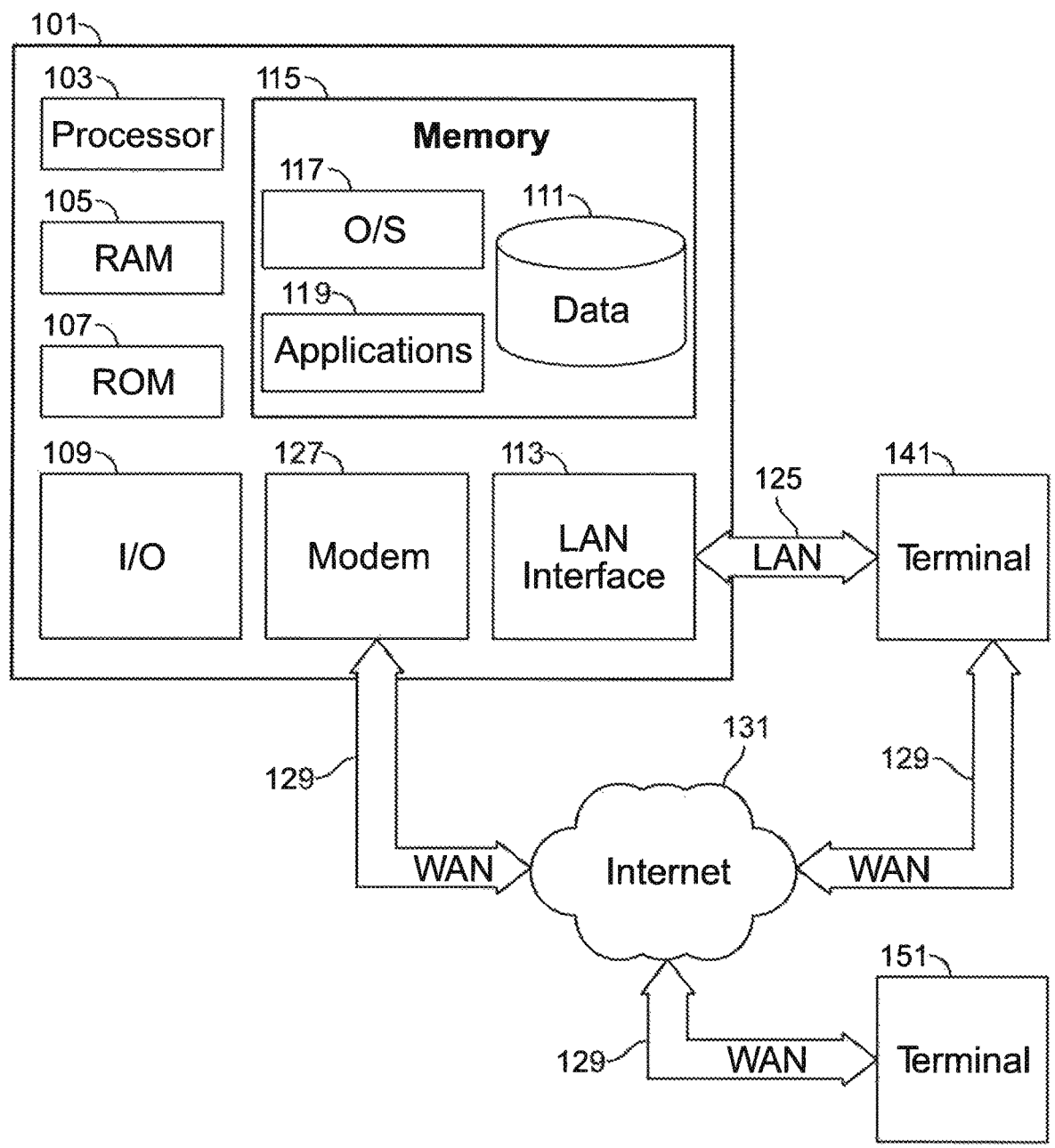
FIG. 1 shows illustrative apparatus in accordance with the principles of the invention.

In some embodiments, an entity may have an interest in populating selected seats for an event with selected participants, such as entity-loyal participants. Such an entity may choose to award ticket purchasing priority to certain entity-loyal participants based on identifiable indications of loyalty associated with the social media IDs or other activity identifying information or websites of such entity-loyal participants. This process may be referred to herein as "social queuing." For the purposes of this application, "social queuing" may be understood to be prioritizing entity-loyal event participants in the ticket purchasing queue based on account history corresponding to social media IDs. Social queuing may also include limiting access, or denying access to certain participants based on account history corresponding to social media IDs or other suitable indicia. In addition, social queuing may be based on activity identifying information obtained from websites and/or apps such as Songkick™, iTunes™, Amazon™, YouTube™, or other such applications that track and/or monitor user affinity to select performers. Information obtained from such applications may be preferable at least because such information is typically pre-screened to insure the integrity of the information.

In embodiments involving such apps, a user may preferably authorize such embodiments to inspect and retrieve information resident in apps and/or websites and then, based on the information obtained therefrom, notify the user regarding upcoming performances in the user's geographic area. Furthermore, such embodiments may preferably provide ticket purchasing opportunities to similar shows or performances. It should be noted that such embodiments may also be used for tracking user interest in movies or other such performances and notifying and/or offering tickets to such performances based upon the tracking.

It should be noted further that such embodiments may also be utilized for determining historical commitment to charitable or commercial organizations or outlets, based, at least in part on dollars contributed or spent over time and/or historical attendance at affairs associated therewith.

Furthermore, such an entity may decide to limit ticket resellers, their software and their associated APIs, from becoming priority event ticket purchasers. Accordingly, such an entity may decide to limit the ticket selection of resellers, their software and their associated APIs.

Illustrative embodiments of apparatus and methods in accordance with the principles of the invention will now be described with reference to the accompanying drawings, which form a part hereof. It is to be understood that other embodiments may be utilized and structural, functional and procedural modifications may be made without departing from the scope and spirit of the present invention.

As will be appreciated by one of skill in the art upon reading the following disclosure, the embodiments may be embodied as a method, a data processing system, or a computer program product. Accordingly, the embodiments may take the form of an entirely hardware embodiment, an entirely software embodiment or an embodiment combining software and hardware aspects.

Furthermore, embodiments may take the form of a computer program product stored by one or more computer-readable storage media having computer-readable program code, or instructions, embodied in or on the storage media. Any suitable computer readable storage media may be utilized, including hard disks, CD-ROMs, optical storage devices, magnetic storage devices, and/or any combination thereof. In addition, various signals representing data or events as described herein may be transferred between a source and a destination in the form of electromagnetic waves traveling through signal-conducting media such as metal wires, optical fibers, and/or wireless transmission media (e.g., air and/or space).

Exemplary embodiments may be embodied at least partially in hardware and include one or more databases, receivers, transmitters, processors, modules including hardware and/or any other suitable hardware. Furthermore, operations executed may be performed by the one or more databases, receivers, transmitters, processors and/or modules including hardware.

FIG. 1 is a block diagram that illustrates a generic computing device 101 (alternately referred to herein as a "server") that may be used according to an illustrative embodiment of the invention. The computer server 101 may have a processor 103 for controlling overall operation of the server and its associated components, including RAM 105, ROM 107, input/output module 109, and memory 115.

Input/output ("I/O") module 109 may include a microphone, keypad, touch screen, and/or stylus through which a user of server 101 may provide input, and may also include one or more of a speaker for providing audio output and a video display device for providing textual, audiovisual and/or graphical output. Software may be stored within memory 115 and/or storage to provide instructions to processor 103 for enabling server 101 to perform various functions. For example, memory 115 may store software used by server 101, such as an operating system 117, application programs 119, and an associated database 111. Alternately, some or all of server 101 computer executable instructions may be embodied in hardware or firmware (not shown). As described in detail below, database 111 may provide storage for social media information, social media identification information, one or more algorithms for use with generating an index according to certain embodiments, existing ticket opportunities, etc.

Server 101 may operate in a networked environment supporting connections to one or more remote computers, such as terminals 141 and 151. Terminals 141 and 151 may be personal computers or servers that include many or all of the elements described above relative to server 101. The network connections depicted in FIG. 1 include a local area network (LAN) 125 and a wide area network (WAN) 129, but may also include other networks. When used in a LAN networking environment, computer 101 is connected to LAN 125 through a network interface or adapter 113. When used in a WAN networking environment, server 101 may include a modem 127 or other means for establishing communications over WAN 129, such as Internet 131. It will be appreciated that the network connections shown are illustrative and other means of establishing a communications link between the computers may be used. The existence of any of various well-known protocols such as TCP/IP, Ethernet, FTP, HTTP and the like is presumed, and the system can be operated in a client-server configuration to permit a user to retrieve web pages via the World Wide Web from a web-based server. Any of various conventional web browsers can be used to display and manipulate data on web pages.

Additionally, application program 119, which may be used by server 101, may include computer executable instructions for invoking user functionality related to communication, such as email, short message service (SMS), and voice input and speech recognition applications.

Computing device 101 and/or terminals 141 or 151 may also be mobile terminals including various other components, such as a battery, speaker, and antennas (not shown).

A terminal such as 141 or 151 may be used by a user of the embodiments set forth herein. Information input may be stored in memory 115. The input information may be processed by an application such as one of applications 119.

Figure 2:
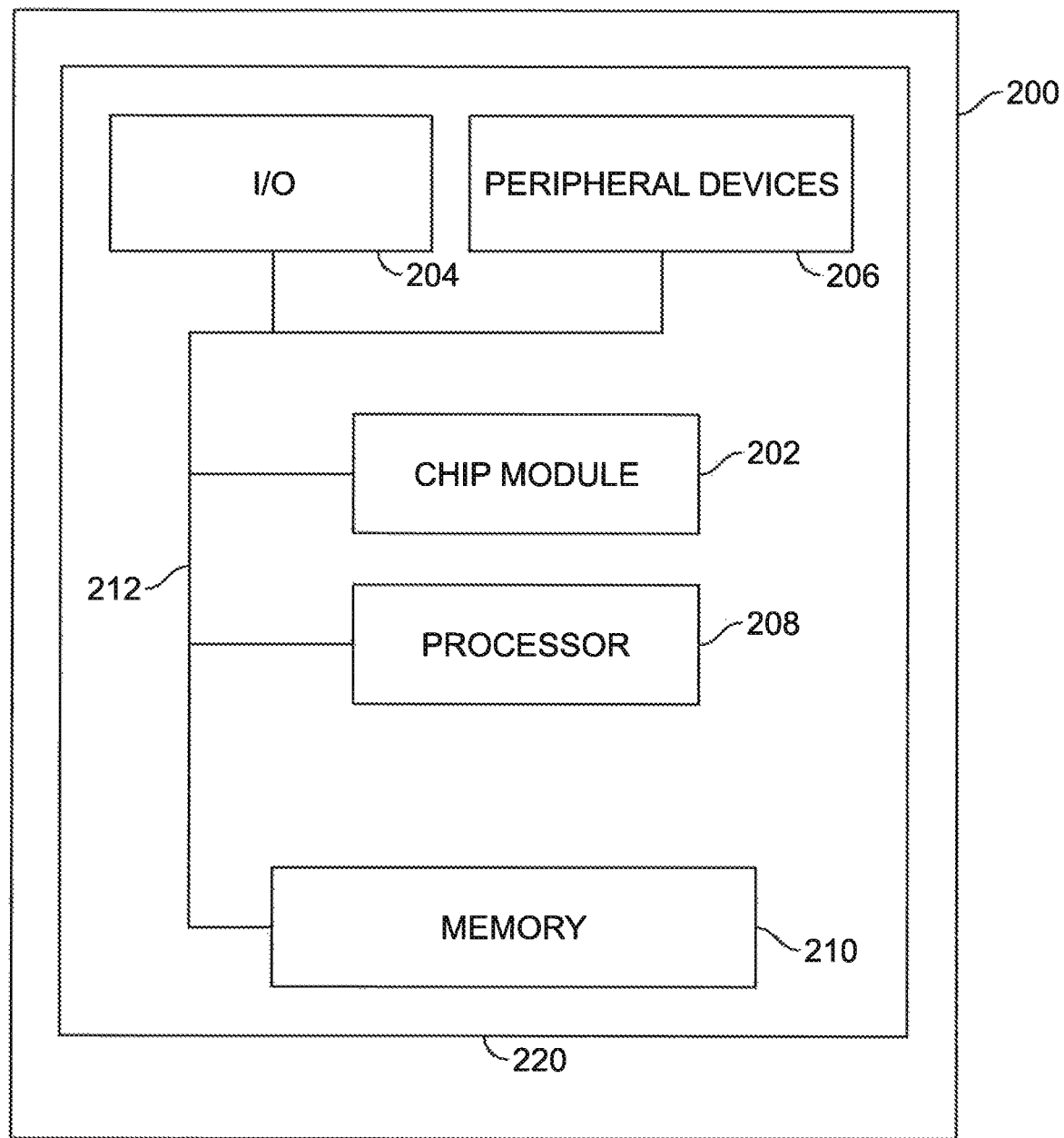
FIG. 2 shows another illustrative apparatus in accordance with the principles of the invention.

FIG. 2 shows an illustrative apparatus that may be configured in accordance with the principles of the invention.

FIG. 2 shows illustrative apparatus 200. Apparatus 200 may be a computing machine. Apparatus 200 may be included in apparatus shown in FIG. 1. Apparatus 200 may include chip module 202, which may include one or more integrated circuits, and which may include logic configured to perform any other suitable logical operations.

Apparatus 200 may include one or more of the following components: I/O circuitry 204, which may include the transmitter device and the receiver device and may interface with fiber optic cable, coaxial cable, telephone lines, wireless devices, PHY layer hardware, a keypad/display control device or any other suitable encoded media or devices; peripheral devices 206, which may include counter timers, real-time timers, power-on reset generators or any other suitable peripheral devices; logical processing device ("processor") 208, which may compute data structural information, structural parameters of the data, quantify indices; and machine-readable memory 210.

Machine-readable memory 210 may be configured to store in machine-readable data structures: social media information, social media identification information, one or more algorithms for use with generating an index according to certain embodiments, existing ticket opportunities, and/or any other suitable information or data structures.

Components 202, 204, 206, 208 and 210 may be coupled together by a system bus or other interconnections 212 and may be present on one or more circuit boards such as 220. In some embodiments, the components may be integrated into a single silicon-based chip.

Apparatus 200 may operate in a networked environment supporting connections to one or more remote computers via a local area network (LAN), a wide area network (WAN), or other suitable networks. When used in a LAN networking environment, apparatus 200 may be connected to the LAN through a network interface or adapter in I/O circuitry 204. When used in a WAN networking environment, apparatus 200 may include a modem or other means for establishing communications over the WAN. It will be appreciated that the network connections shown are illustrative and other means of establishing a communications link between the computers may be used. The existence of any of various well-known protocols such as TCP/IP, Ethernet, FTP, HTTP and the like is presumed, and the system may be operated in a client-server configuration to permit a user to operate processor 208, for example over the Internet.

Apparatus 200 may be included in numerous general purpose or special purpose computing system environments or configurations. Examples of well-known computing systems, environments, and/or configurations that may be suitable for use with the invention include, but are not limited to, personal computers, server computers, hand-held or laptop devices, mobile phones and/or other personal digital assistants ("PDAs"), multiprocessor systems, microprocessor-based systems, tablets, programmable consumer electronics, network PCs, minicomputers, mainframe computers, distributed computing environments that include any of the above systems or devices, and the like.

A ticket distribution system according to some embodiments may include a receiver. The receiver may be configured to receive a plurality of logins. Each of the logins may be intended for an event ticket purchase. Each of the logins may include an e-mail address or other electronic information associated with a user. Each of the logins may include social media identification information such as social media IDs. Each of the logins preferably facilitates the obtaining of account history associated with social media IDs or other suitable history relating to the user.

The system may also include a processor. The processor may be configured to retrieve account history associated with the social media ID. The retrieval of account history may preferably occur pursuant to a pre-registration by an event ticket purchaser. The pre-registration may occur at some pre-determined time prior to when the tickets are offered for sale.

Such a pre-registration may preferably grant access to a system to retrieve substantially all (or most, or some) information from the account history of the social media ID. Further, such a pre-registration may allow the system to further retrieve related information from other social media sites linked to the social media site to which the system has been granted access. Such a pre-registration may allow the system to further retrieve related information from other general sites, such as, for example, Spotify™, a music-downloading site, linked to the social media site to which the system has been granted access.

The processor may be further configured to calculate an index value associated with the login and/or other identifying information. The index value may be based, at least in part, on the retrieved account history. The index value may be based, at least in part, on the retrieved information from sites related, or otherwise linked, to the social media site.

When the index value associated with a login is above (or below, in other embodiments) a pre-determined threshold value, the processor may be further configured to assign a priority flag to the login. The priority flag may enable a real-time ticket event purchase not available in real-time to a non-flagged login. Other benefits awarded to a priority login are also within the scope of this invention.

The index value may also be based, at least in part, on other historical information such as, for example, historical ticket purchases for performances that the user attended. Such attendance at performances may be verified information obtained from credit card, debit card, or other suitable payment instrument, activity at the performances; government identification instruments provided at performances; apps that are resident on a person's mobile device that are used to process and/or present tickets at a performance and can verify attendances thereat; and/or other third party information which can be used to verify historical performance attendance.

The account history may include at least one preferably time-stamped indication of affinity for an entity, such as a performing entity, associated with the event. The account history may include at least one occurrence of a tagging of a photograph of an entity associated with the event.

The account history may also include at least one occurrence of a linking of a photograph of a performing entity associated with the event to the profile of the social media ID. The linking of the photograph of the performing entity associated with the event to the profile of the social media ID may be the same as, or different from, the tagging of a photograph of the performing entity associated with the event to the profile of the social media ID.

The account history may also include an indication of a threshold amount of streaming audio time related to a performing entity associated with the event. Such streaming audio time may preferably be obtained by accessing, via the social media ID, linked account(s) at a streaming audio website, and downloading, therefrom, streaming audio information.

The account history may also include one or more parameters that indicate whether the social media ID is related to an automated entity or a human entity. The parameters may include at least one of pre-determined number of friends on the account. The parameters may include a pre-determined ticket purchasing frequency. The parameters may include a location or quantity of historic ticket purchases and historic reaction time to ticket offers or other suitable indicia of ticket reselling history. In certain embodiments, the parameters may include a determination as to whether the social media ID is related to an entity that has a history of ticket reselling. Such an entity, or ID, may preferably be flagged or placed on a watch list for future attempts to purchase tickets.

Embodiments may include a method for simulating a social media account history. The method may include generating a social media ID or using an already existent social media ID.

Embodiments of methods may also include creating an account history for the social media ID with respect to a pre-determined entity. The pre-determined entity may be the entity associated with the event. The tickets may provide an opportunity to view the entity at the event.

The creating may include using the social media ID to create at least one time-stamped indication of affinity for the pre-determined entity. The creating may include using the social media ID to tag a photograph of the entity. The method may also include linking the social media ID to a photograph of the pre-determined entity. The method may also include using the social media ID to store a threshold amount of streaming audio time relating to the pre-determined entity.

Historical purchase(s) of merchandise, such as t-shirts, mugs, or other performer associated paraphernalia, may also indicate an affinity for the pre-determined entity. In some embodiments, using time stamps associated with such purchase(s) of merchandise to indicate affinity for the pre-determined entity may provide deeper insight into the historical tendencies of users.

The method may further include querying the account history to determine whether the account history includes one or more parameters that indicate whether the social media ID is related to an automated entity or a human entity.

For example, if it is determined that the social media ID includes less than a threshold number of friends on the account, then this may be an indication that the social media ID is related to an automated entity. Alternatively, if it is determined that the social media ID includes more than a threshold frequency of historic ticket purchases per unit time then it may be determined that the social media ID is related to an automated entity.

In yet another alternative embodiment, if it is determined that the social media ID has purchased tickets for events in geographically disparate locations of historic ticket purchases, and, in some embodiments, the events associated with such ticket purchases take place within a certain amount of time, then this may be an indication that the social media ID is related to an automated entity. Yet another indication that the social media ID is related to an automated entity is that the entity may include a historic record of more or less than a threshold reaction time to a plurality of ticket offers.

Figure 3:
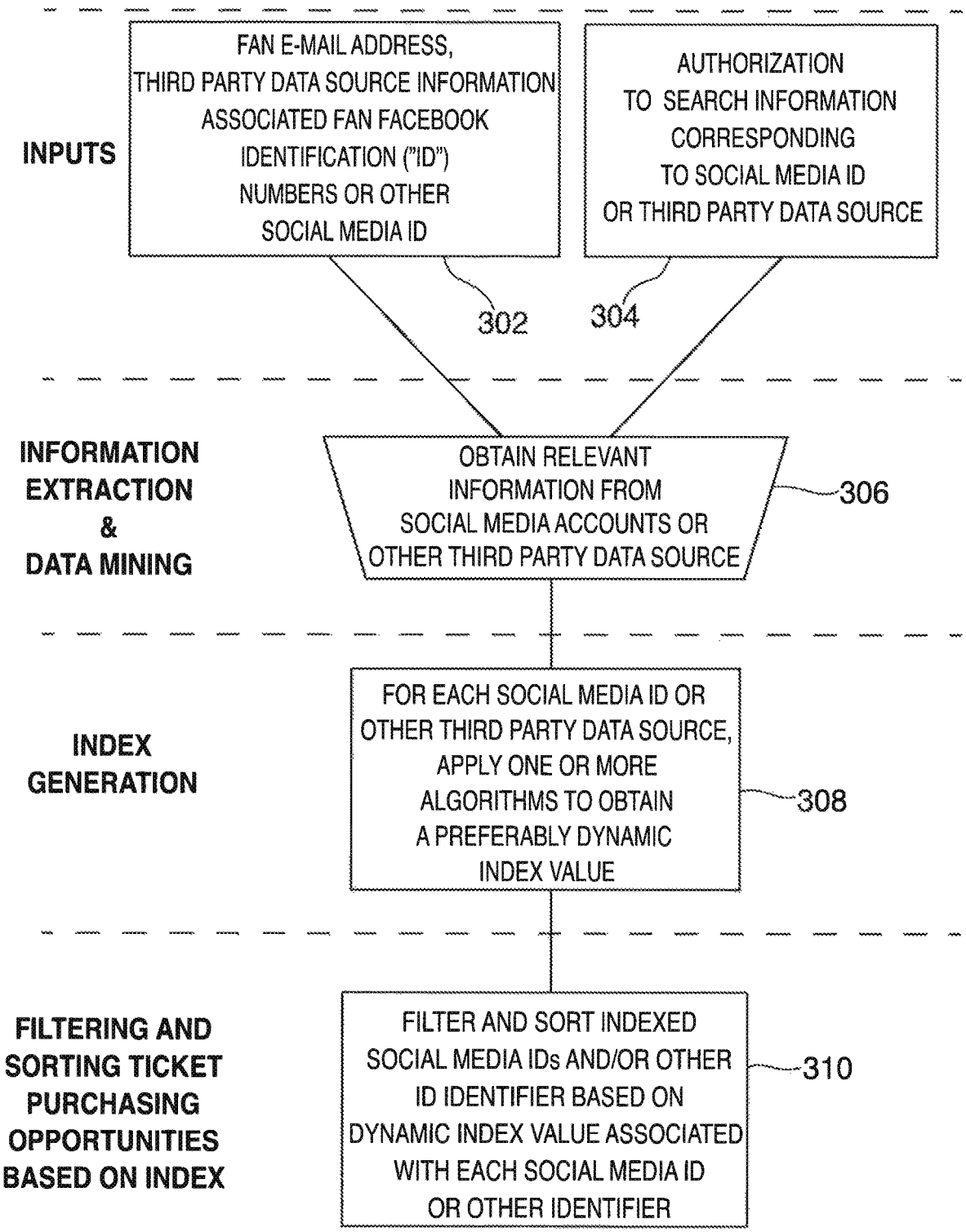
FIG. 3 shows an illustrative flow diagram of methods according to certain embodiments.

FIG. 3 shows an illustrative flow diagram of methods according to certain embodiments. Step 302 shows receiving e-mail addresses, Facebook™, third party data source identification information (such as identification information for logins and/or passwords to Songkick™, iTunes™, Amazon™) or other suitable media, identification ("ID") numbers associated therewith and/or one or more other social media IDs. Such information may be received, for example, from logins to an entity's (such as a music band, a solo performer, a sports team, a theatrical production, a particular venue, a particular brand in support of a series of performances such as the Budweiser™ Made in America Festival™ series or other suitable entity, venue or brand) web site (while much of the disclosure herein relates to performers or bands, nevertheless it should be understood that the disclosure relates as well to any suitable performer, venue, band or entity related thereto). In one embodiment, the entity's web site may preferably support a platform for receiving participant logins. Such a platform may preferably provide a place to enter a social media ID. Such a platform may preferably allow for transfer of such social media IDs to a centralized data storage location such that the social media IDs can be fully inspected at a later date.

Step 304 shows receiving authorization from users to search information corresponding to the social media IDs or third party data source identification information. Authorization information is preferably logged with the third party and used in accordance with the third party's own terms and conditions. Such authorization may preferably include password information and/or other information necessary to enable access to the participant's accounts.

Step 306 shows, preferably using the enabled access to the user's accounts, obtaining relevant information from participants' social media accounts or third party data source identification information. Such relevant information may include transactions, posts, downloads, e-mail addresses and any other suitable stored information on the participant's social media accounts or third party data source identification information.

In certain embodiments, the user may restrict access to certain portions of the social media or third party data source identification information. For example, the user may select areas of his social media or third party data source identification information to which the access is limited.

In certain embodiments, access to the user's social media accounts or third party data source identification information may be obtained using cookies, or tracking cookies, to follow and store the user's internet navigation. As a general matter, tracking cookies may be used to track internet users' web browsing.

Such cookies, or tracking cookies, may preferably be used with the consent of the users. In view of the foregoing, it should be noted that information may be obtained from users either by the users providing the information or by following user navigational behavior.

In instances where the user's navigation is being tracked, certain embodiments may include offering the user predetermined event ticket purchase opportunities preferably at select times. Such opportunities may preferably be provided to the user during the user's navigation. Such opportunities may preferably correspond to the user experience during the user's navigation.

For example, when a user navigates to Spotify™ and streams a performer's music and is in the process of listening to the music, the embodiments may, preferably in real time, electronically notify the user of an event ticket purchase opportunity. Such notification may preferably allow the user to immediately access the event ticket purchase opportunity. Such notification may preferably be sent by e-mail, text, using a website, using an app associated with third party data source identification information and/or posting to a user's social media account (such as a Facebook™ account or other suitable account.) Such a notification may be shown on a screen of a device, transmitted as an audio advertisement in the app., browser or other software interface in which Spotify™ is being used. Such notification may be sent by multiple transmission channels. In certain embodiments, such a transmission may preferably include a termination time whereby the ability to exercise the event ticket purchase opportunity may terminate at some pre-determined time in the future following the transmission of the notification.

Step 306 may also preferably including data mining the extracted information to determine participant tendencies such as affinity for one or more performing entities, ticket purchasing frequency, geographic location of ticket purchasing, number of friends, etc. Data mining may include using data from participant visits to web sites hosted by systems according to the invention. Data mining may include using data from participant visits to web sites hosted by systems in communication with systems according to the invention. Data mining may include using data from cookies, such as tracking cookies, or other such mechanisms to better understand participant web navigation and, thereby, to better understand participant tendencies. Data mining may include using data from third party data sources such as certain apps.

An example of data mining according to certain embodiments may include identifying tendencies of certain individuals over time. Once certain individuals have been identified by, for example, systems and methods of embodiments described herein, such individuals may be targeted and offered ticket purchase opportunities ordinarily not available to non-identified individuals. One component of such identification may be a dynamic register of time spent on a music streaming site listening to the music of a pre-determined performer. When a particular individual is identified as listening to a performer on a music downloading site at a pre-determined high threshold rate of music per unit time, or more than a pre-determined high threshold amount, then such an individual may be offered ticket purchase opportunities for the performer typically not available to non-identified individuals.

Another example of data mining may including using identified tendencies from third party data sources such as Songkick™, iTunes™, and/or Amazon™ or other suitable third party data sources.

Step 308 shows index generation. For each social media ID, such index generation may include performing one or more algorithms to obtain a preferably dynamic index value. Such a dynamic index value may be updated in response to changes to the participant's social media ID (which would preferably retrieve information from the social media on a real-time, or substantially real-time, basis). In some embodiments, such a dynamic index value may preferably be adjusted in response to active index factors.

Such active index factors may include a determination that the participant has recently contributed to one or more charities on a list. In certain embodiments, a determination that a participant has contributed to one or more charities on a list may be used to increase the index score of an interested participant with respect to a predetermined event and/or entity. Such factors may include a determination that a participant has executed one or more tweet(s) or other social media action regarding an event. Tickets for such an event may be currently, or imminently, offered for sale. In certain embodiments, a determination that a participant has executed one or more tweet regarding an event may be used to increase the index score of an interested participant. In certain embodiments, the number of execution of tweets may obtain a proportional effect on the index score. More tweets, or a higher rate of tweets per unit time, or other suitable metric, may preferably obtain a greater effect on the index score.

In some embodiments, only non-triggered tweets, non-reward-based tweets or tweets in a non-reward-based channel may preferably obtain an effect on an index score. Non-triggered tweets may include tweets that are not responsive to a previous in time promotional advertisement requesting tweets or similar behavior. Non-reward-based tweets may include tweets that are not responsive to a previous in time reward program that rewards users who execute such tweets. Tweets in a non-reward-based channel may include tweets executed in a channel that is not identified in a rewards program instituted by a performer, brand, or other suitable entity.

In certain embodiments, such a dynamic index value may be updated periodically, preferably on a system-set schedule. In some embodiments, the dynamic index value may be updated according to a user-defined schedule. Such an index may preferably reflect a history of the participant with respect to the entity seeking the information.

Step 310 shows filtering and sorting indexed social media IDs or third party data source identification information. Such filtering and sorting may be executed prior to offering for sale tickets to an event. The filtering of social media IDs or third party data source identification information may be performed to eliminate, or limit, purchasing rights of certain sub-optimal ticket purchasers such as potential ticket resellers. As mentioned above, such potential resellers may preferably provide automated software utilizing APis (or not utilizing APIs) for attempting to purchase tickets. Such potential ticket resellers are typically less desirable because they may resell the tickets independent of consideration of the respective loyalty to the performer of the end purchasers. Instead, such potential ticket resellers may only consider the end purchasers who can pay the highest price for the tickets instead of the end purchasers who can pay only a lower price but, in view of their history, may be considered more devoted fans of the performer.

The sorting of the indexed social media IDs may be performed to increase the likelihood that more dedicated, loyal and/or committed participants may be awarded tickets to a predetermined event.

In certain embodiments, when tickets are actually offered for sale, potential ticket purchasers with relatively higher index scores may receive higher priority in the form of a better chance of receiving ticket purchasing opportunities as well as more desirable tickets—e.g., with more desirable locations. In some embodiments, other incentives offered to loyal participants may include V.I.P. upgrades for tickets, backstage access, meet and greet opportunities, discounted merchandise, variable and preferred ticket pricing and/or other incentives for higher index scores.

Figure 4:
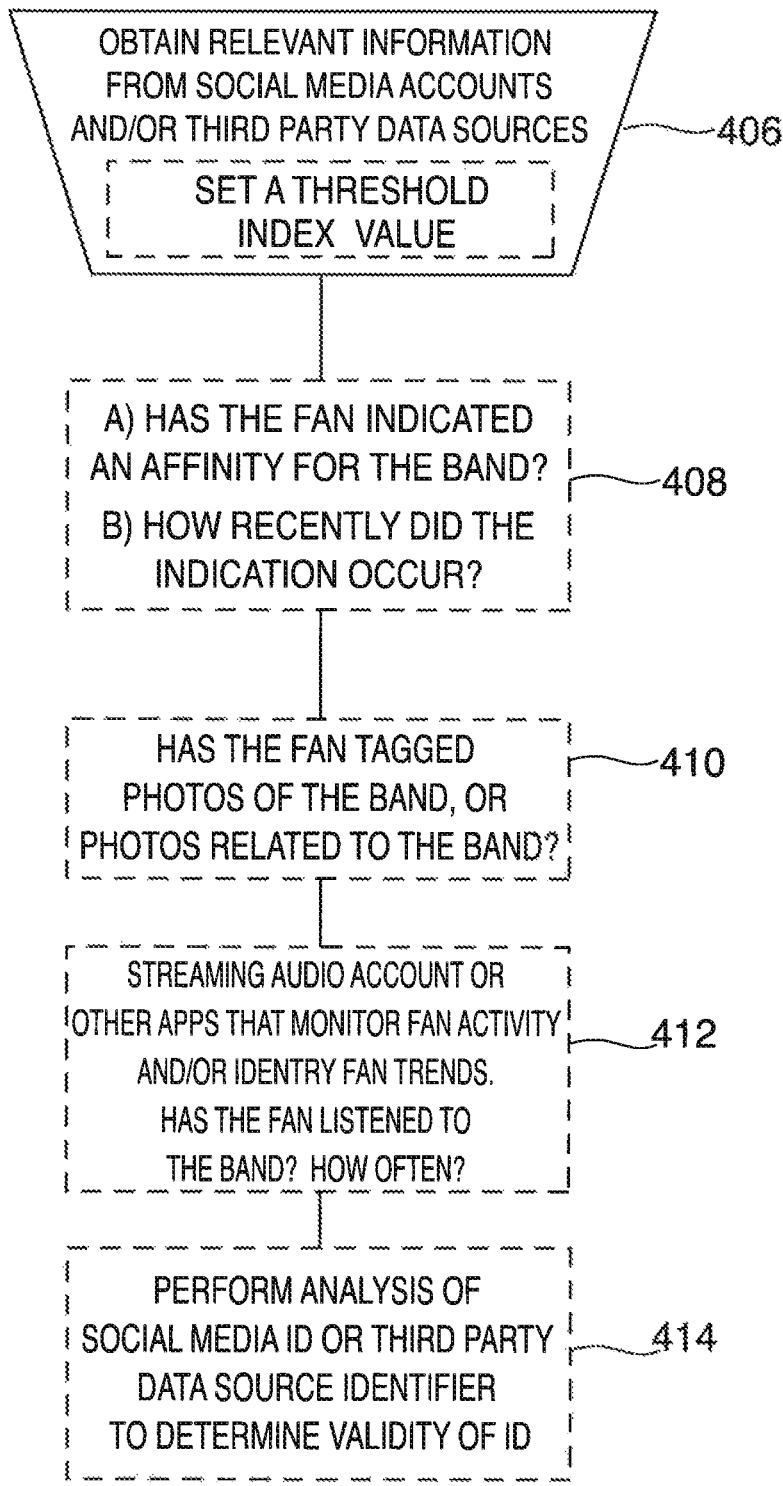
FIG. 4 shows an illustrative flow diagram of information extraction and data mining according to certain embodiments.

FIG. 4 shows an illustrative flow diagram of information extraction and data mining according to certain embodiments. Step 406 shows obtaining relevant information from social media accounts and/or third party data sources. Step 406 also shows the optional setting of a threshold index value. A threshold index value may preferably enable a determination as to whether a potential ticket purchaser qualifies for a pre-determined priority ticket purchasing opportunity. The index value may be formed from answers to the queries set forth in steps 408, 410 and 412 as well as the analysis performed in step 414.

Step 408 may query the available social media history to determine whether the potential ticket purchaser's social media history indicates that he or she has an affinity for the entity. The affinity may be determined by a finding of statements such as "I love this entity," or other such similar statements which juxtapose words of affection within a certain number of words of the entity.

Step 408 also shows that the timeliness of the statement of affinity may also affect the index value, and/or the identity determination, of the potential ticket purchaser. For example, step 408 shows that the timing of the statement of affinity may form part of the analysis to determine whether the potential ticket purchaser has a current and active affinity for the band or other suitable performer.

Step 410 shows another possible factor for determining the level of the potential ticket purchaser interest in the entity, such as a band. Specifically, step 410 shows determining whether the participant has tagged photos of the band, as is known in the art of social media, or photos related to the band. Such tagging preferably indicates a level of affinity for the band using a different metric than the heretofore described metrics.

Step 412 shows yet another possible factor for determining the level of the potential ticket purchaser interest in the band. Specifically, step 412 shows using the social media ID and/or third party data sources that monitor fan activity and/or identify fan trends to determine how often the participant has used his or her streaming audio account, such as a streaming audio account on Spotify™, to listen to the band, or how often the fan has visited a particular performers website. Alternatively, a data source app which tracks user affinity may also be exploited for monitoring both the user affinity and/or performance concert plans for performers in which the user has expressed an interest. Such an embodiment may preferably enable a system to provide ticket purchasing opportunities to select users. Furthermore, such use of a streaming audio account, or such multiple visits to a performers website, may indicate affinity for the performer at least because such use shows that the potential ticket purchaser has a history of listening to the band's music and/or visiting the performer's website.

In some circumstances, an API may be administered by automated software associated with a ticket-buying entity such that the entity utilizes the API to purchase tickets. Such an API may be designed to interface with a ticket-selling entity. Such automated software may be programmed to use a custom-designed API to purchase either as many tickets as possible, or the highest quality tickets, or some other suitable parameter associated with ticket purchasing. Such automated software may be utilized by ticket resellers, commonly referred to as "scalpers" or "touts," to increase the success rate, with respect to quality and/or quantity, of purchasing tickets. Such automated software may increase the success rate of ticket purchasing at least because it is automated and provides quicker reaction time to queues delivered by ticket sellers and/or timing of ticket sales.

In some embodiments, a band may wish to populate selected, preferably desirable, seats for a concert with loyal participants. Accordingly, such a band may award concert ticket purchasing priority to certain loyal participants based on identifiable indications of loyalty associated with the social media IDs of such loyal participants. As described above, this process may be referred to herein as social queuing. These, or other, embodiments may include restricting automated accounts to purchasing less desirable seats. In certain embodiments, a time delay in the queue may allow for the queue operator to operate and assign event ticket purchase opportunities.

Certain embodiments may not use a queue at all to assign event ticket purchase opportunities but rather may immediately assign ticket purchase opportunities in response to the characterization of the user based on information keyed to the user's social media ID or other suitable information.

Certain embodiments may use multiple queues to assign event ticket purchase opportunities. In certain embodiments, each queue may be prioritized, with respect to the other queues, based on the index score of the members of the queue. In certain embodiments, the members of the queue may be rated based on the timestamp of the attempted ticket purchase by the member of the queue and/or in combination with the index score of the member.

Step 414 shows the above-described factor for determining the level of potential ticket purchaser interest in the band. Specifically, step 414 shows performing analysis of account history associated with social media ID to determine validity of ID—e.g., is the social media ID associated with a human being or is it associated with automated software. In other words, does the account activity associated with the social media ID indicate that the social media ID is controlled by automated software. Social queuing as disclosed herein may preferably be used to determine whether the social media ID, and login associated therewith, is controlled by automated software.

Figure 5:
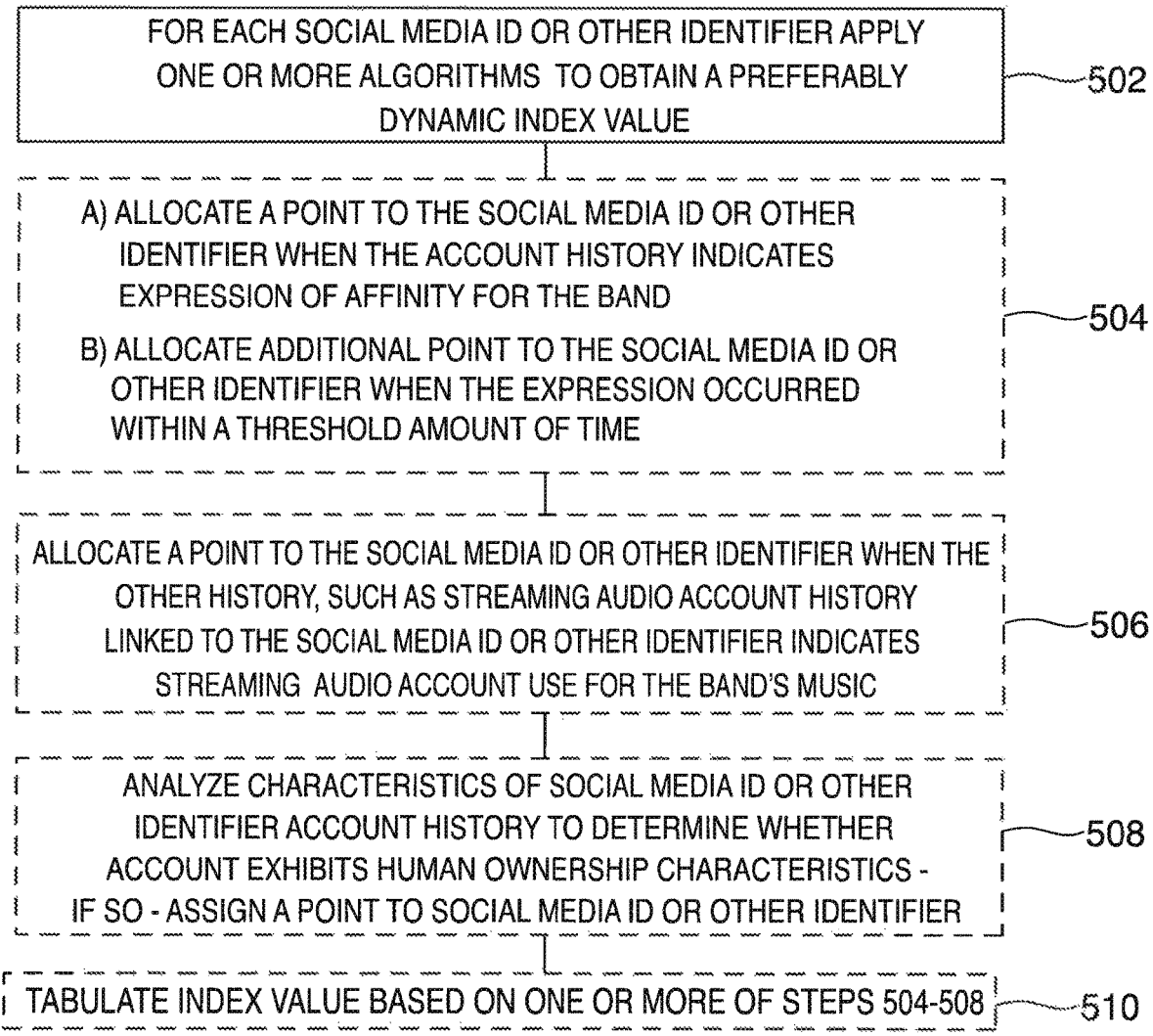
FIG. 5 shows an illustrative flow diagram of index generation according to certain embodiments.

FIG. 5 shows an illustrative flow diagram of index generation according to certain embodiments. Step 502 shows, for each social media ID and/or third party data source, performing one or more algorithms to obtain a preferably dynamic index value. The algorithms may contain one or more of optional steps 504-512 or other suitable steps.

Step 504 shows the exemplary step of allocating one point (or other suitable quantum) to a social media ID and/or third party data source identifier when the social media account history indicates an expression of affinity for the band. Such expressions may include a finding of "love" or "like" within a pre-determined number of words of the band. Alternative determinants of affinity may also be utilized.

Step 504 also shows allocating an additional point (or other suitable quantum) to the social media ID and/or third party data source identifier when the expression occurred within a threshold amount of time with respect to the date for which the tickets are being sold. For example, if, once a showing of affinity has been confirmed, then the showing of affinity may be given an extra point (or other suitable quantum) if the showing of affinity occurred within six (6) months of the prospective date for the concert for which the tickets are being offered.

Step 506 shows yet another exemplary step of allocating one point (or other suitable quantum) to the social media ID and/or third party data source identifier when other history linked to the social media account, such as a streaming audio account history—e.g., a Spotify™ history—indicates streaming audio account use of the band's music. Such an indicator may be binary—e.g., if the person has listened to the band on his or her streaming audio account then the system allocates a point—or the indicator may require traversal of a threshold—e.g., if the person has listened to the band more than a threshold amount of times, the threshold amount of times, in one exemplary embodiment, being spread over a pre-determined period—then the system allocates a point (or other suitable quantum).

Step 508 shows allocating a point (or other suitable quantum) to the social media ID and/or third party data source identifier when the characteristics of the social media ID account history and/or third party data source identifier history indicate human ownership and control of the social media ID account and/or account associated with the third party data source identifier. For example, if the identifier has less than a pre-determined number of "friends" links, than it may be assumed that the identifier is fraudulent and in fact is an identifier generated by automated software or is in some other way a computer-related entity. In certain embodiments, when an identifier has been determined to be associated with automated software or other computer-related-entity then such an identifier may preferably be relegated to purchase tickets in certain sub-optimal seating areas or completely barred from purchasing tickets.

In certain embodiments, friends identified in connection with a user's social media ID or other suitable identification information may preferably be tested to determine whether the friends are genuine or simulated friend accounts.

In certain embodiments, entire communities of "friendly" accounts, whether social media accounts or other third party data source accounts, may be created to interact with one another in order to generate "friends" on the accounts. Such activity may be used to simulate human account attributes. It should be noted that such activity may also be measurable at least in part by measuring the commonality of the interactions between various members of groups. More specifically, such commonality may be simulated and/or detected by repeated communications between certain friends and/or higher than average level per unit time of communications among certain groups of friends.

Step 510 shows tabulating an index based, at least in part, on one or more of steps 504-508. Such tabulation may include adding all the points (or other suitable quanta) accrued in one or more of steps 504-508. Following the tabulation (or other suitable calculation), the sum of the points (or other suitable quanta) accrued may be compared to a threshold value. In certain embodiments, if the sum of the points (or other suitable quanta) is equal to or greater than the threshold value, then the identifier may be awarded priority ticket purchasing opportunities. Such priority ticket purchasing opportunities may include more optimal seating, lower prices on seats, first choice at certain seats and/or first choice at ticket purchasing.

Figure 6:
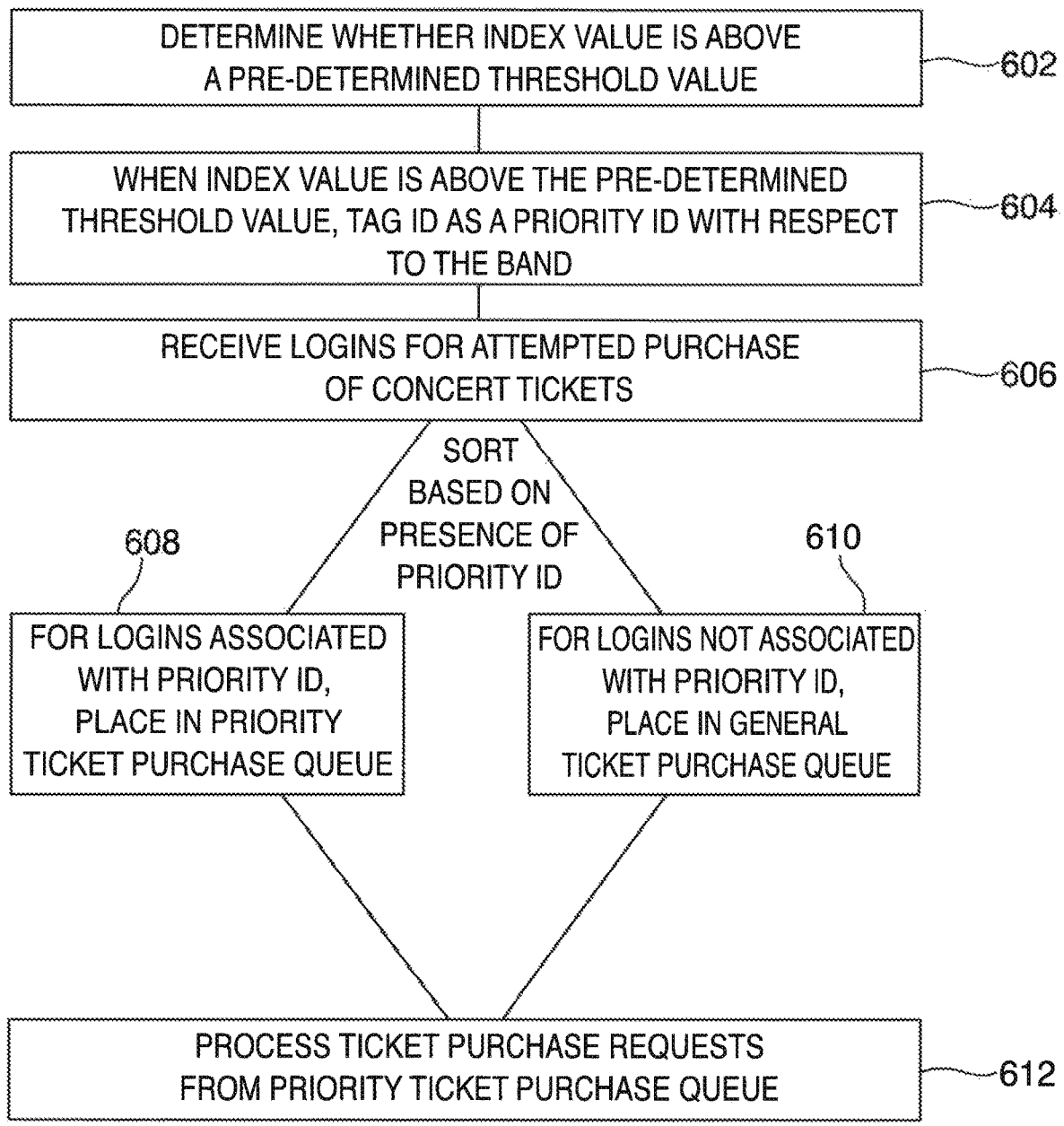
FIG. 6 shows an illustrative flow diagram of filtering and sorting ticket purchasing opportunities based on the index.

FIG. 6 shows an illustrative flow diagram of filtering and sorting ticket purchasing opportunities based on the index. Step 602 shows determining whether the index value is above a pre-determined threshold value (similar to the portion of the specification above corresponding to step 510 in FIG. 5.)

Step 604 shows, when the index value is above the pre-determined threshold value, tagging the social media ID as a priority ID with respect to the band. Step 606 shows receiving logins for attempted purchases of concert tickets. Following step 606, the system may sort the attempted purchase requests based on the presence or absence of priority IDs. It should be noted that the determination as to whether the logins include priority IDs should preferably be formulated at least some pre-determined amount of time prior to receiving purchase requests. Accordingly, for a party to receive priority treatment regarding ticket purchasing, it may have to pre-register at least some pre-determined amount of time prior to when the tickets are offered for sale.

Step 608 shows that, for logins, and attempted purchase requests pursuant thereto, associated with priority IDs, the system may place such attempted purchase requests in the priority ticket purchase queue. Step 610 shows that, for logins not associated with priority ID, the system may place such logins, and associated ticket purchase requests, in general ticket purchase queue. Step 612 shows that, preferably following receipt of priority ticket purchase requests, such requests are processed—i.e., seats are sold to the priority ticket purchase requests on a first-come, first-served basis.

In certain embodiments, an automated ticket reseller may have simulated a human ticket purchaser too well. Such an automated ticket reseller may score higher than humanly possible in the formulation of an index. As such, certain embodiments may indicate that when the index value is above a second pre-determined threshold value, the social media ID may be tagged as a non-priority ID with respect to the band.

Figure 7:
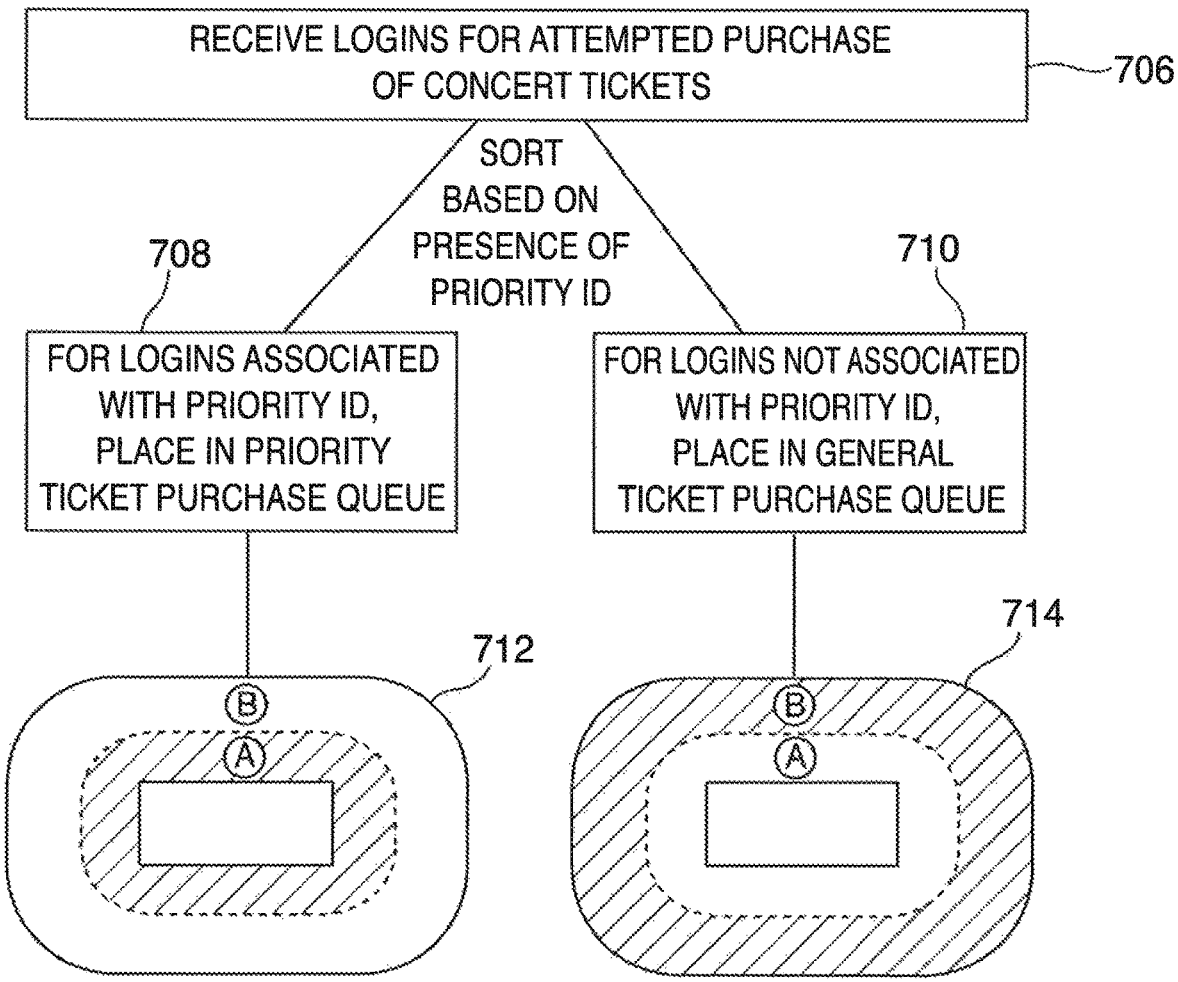
FIG. 7 shows an illustrative hybrid flow diagram of filtering and sorting ticket purchasing opportunities based on the index with event seating maps.

FIG. 7 shows an illustrative hybrid flow diagram of filtering and sorting ticket purchasing opportunities based on the index and the outcome of such filtering and sorting as expressed in event seating maps. Steps 706-710 are similar to steps 606-610. Specifically, step 706 shows receiving logins for attempted purchase of concert tickets. Following step 706 the system may sort the attempted purchase requests based on the presence or absence of priority IDs. Step 708 shows that, for logins, and attempted purchase requests pursuant thereto, associated with priority IDs, the system may place such attempted purchase requests in the priority ticket purchase queue. Step 710 shows that, for logins not associated with priority ID, the system may place such logins, and associated ticket purchase requests, in general ticket purchase queue.

Event ticketing map 712 shows that, preferably following receipt of priority ticket purchase requests, such requests are processed such that more desirable seats in section A are available to priority ticket purchase requests. Event ticketing map 714 shows that less desirable seat in section B are available to non-priority ticket purchase requests.

Figure 8:
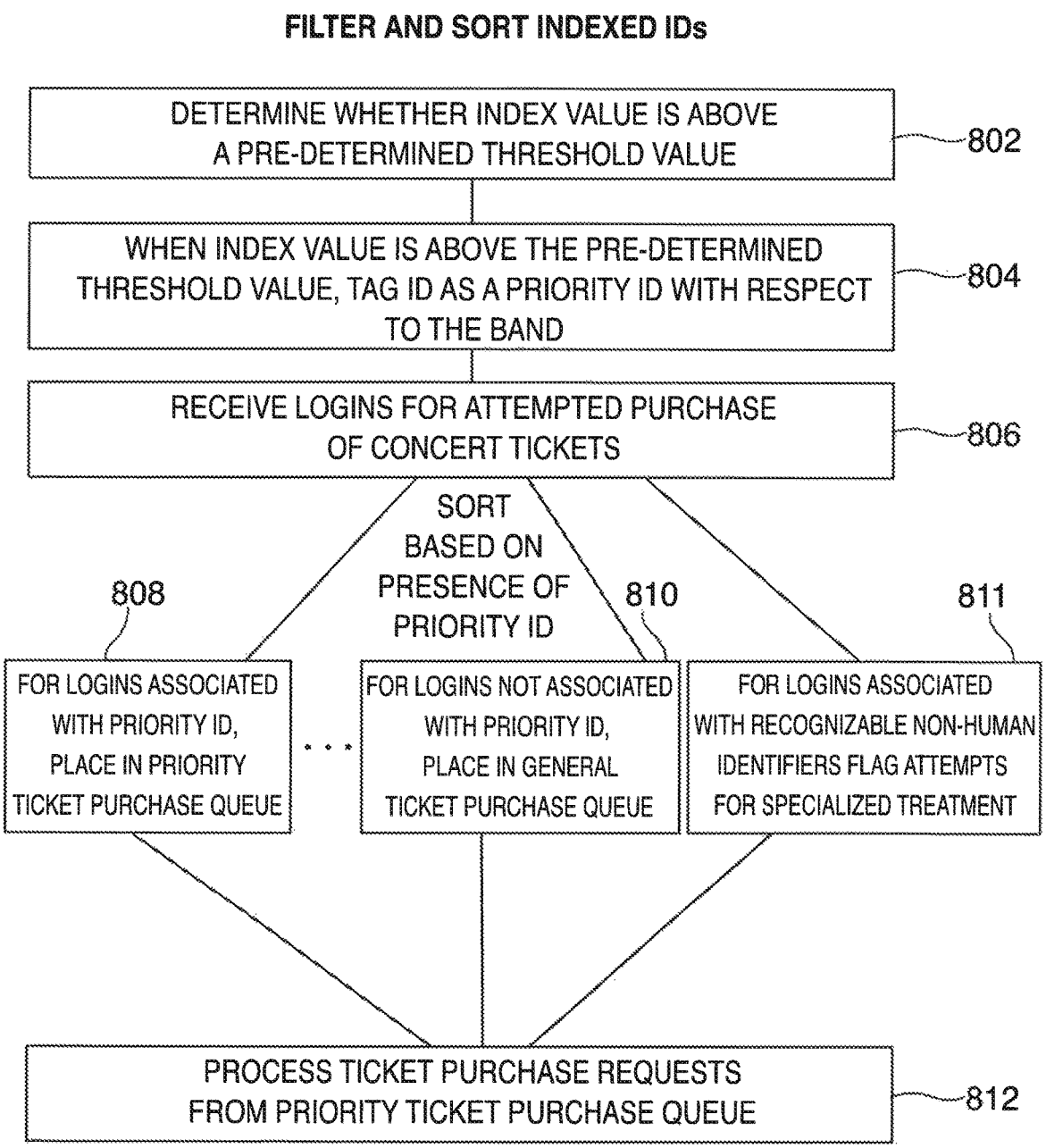
FIG. 8 shows an illustrative flow diagram of filtering and sorting ticket purchasing opportunities based on the index.

FIG. 8 shows yet another illustrative hybrid flow diagram of filtering and sorting ticket purchasing opportunities based on the index. In fact, all of elements 802, 804, 806, 808, 810 and 812 correspond to similar elements in FIG. 6. The only difference between FIG. 6 and FIG. 8 is that FIG. 8 incorporates another path, 811, in the sorting step. Whereas FIG. 6 included a binary decision associated with a determination as to whether the login was a priority login or non-priority, FIG. 8 illustrates that systems and methods according to the invention may preferably include various paths.

For example, FIG. 8 preferably illustrates that embodiments may preferably include multiple levels of priority, as shown by the ellipses between 808 and 810 as well as the new path 811. Such levels may preferably be determined based on different threshold levels of index scoring. Step 811 may preferably identify logins associated with recognizably non-human purchasing agents and flag such logins for special treatment as described herein.

It should be noted that the various embodiments identified herein may be used together. It should be noted that the various embodiments identified herein may partially be used together such that one or more features identified in connection with a single embodiment may be used in connection with one or more other embodiments identified herein. It should be noted further that the order of steps of any method claim or description of method herein should be understood, unless expressly stated to the contrary, to not be limited to any particular order but rather should be understood to include any order that is both logically and grammatical correct.

Thus, methods and apparatus for leveraging social queuing to facilitate event ticket distribution and to identify and/or prevent ticket purchaser simulation have been provided. Persons skilled in the art will appreciate that the present invention can be practiced in embodiments other than the described embodiments, which are presented for purposes of illustration rather than of limitation, and that the present invention is limited only by the claims that follow.

We claim:

1. A method for determining a probability of users to assign a priority flag associated with an access to login for requesting tickets to access a resource, the method comprising:
   receiving information of a plurality of databases associated with a user account of a first user, wherein data of user interactions for an entity associated with the resource is stored on the plurality of databases;
   receiving user authorization to query the plurality of databases based on user input on an interface;
   retrieving social media history associated with the user account of the first user from the plurality of databases, wherein the social media history is generated based on the user interactions for the entity extracted from a plurality of social media accounts of the first user or third party data sources;
   determining an affinity for an entity associated with the resource based on analysis of the social media history;
   assigning an index value as a function of:
      a time measured of the user interactions for the entity during a time window prior to the resource, and
      the affinity;
   determining if the index value exceeds a threshold; and
   assigning the priority flag to the first user based on exceeding the threshold to allow enhanced access for requesting the tickets for the resource.

2. The method according to claim 1, further comprising:
   determining a time period of streaming content related to the entity; and
   determining the affinity for the entity based on the time period of streaming content related to the entity.

3. The method according to claim 1, further comprising:
   determining instances of interactions of the first user with images associated with the entity in the plurality of social media accounts, and
   determining the affinity for the entity based on the instances of the interactions of the first user with the images associated with the entity.

4. The method according to claim 1, further comprising:
   assigning the priority flag comprising providing the user account as a priority account, and
   tagging the user account as the priority account enables the first user to have better probability of allocation of the tickets in comparison to a second user having absence of priority account.

5. The method according to claim 4, further comprising:
   receiving a request from a plurality of users for the tickets for the resource;
   classifying the plurality of users based on presence of the priority account or absence of the priority account; and
   prioritizing a first set of users of the plurality of users having the priority account in a digital queue, for allocating the tickets, in comparison to a second set of users of the plurality of users having absence of the priority account.

6. The method according to claim 1, further comprising:
   executing analysis of characteristics of the user account to identify the first user as a human or an automated entity; and
   assigning the index value based on the analysis of the characteristics of the user account.

7. The method according to claim 6, further comprising:
   determining a frequency of historical ticket purchases associated with the user account; and
   executing the analysis of the characteristics of the user account based on comparison of the frequency of the historical ticket purchases with a threshold frequency.

8. The method according to claim 6, further comprising:
   determining association of the user account with ticket reselling history; and
   executing the analysis of the characteristics of the user account based on the association of the user account with the ticket reselling history.

9. The method according to claim 6, further comprising:
   determining a number of friends associated with the user account; and
   executing the analysis of the characteristics of the user account based on comparison of the number of friends with a predetermined number of friends.

10. The method according to claim 1, wherein receiving user authorization to query the plurality of databases comprises receiving password information from the first user to access the plurality of databases.

11. A system for determining a probability of users to assign a priority flag associated with an access to login for requesting tickets to access a resource, the system comprising:
    at least one processor configured to:
       receive information of a plurality of databases associated with a user account of a first user, wherein data of user interactions for an entity associated with the resource is stored on the plurality of databases;
       receive user authorization to query the plurality of databases based on user input on an interface;
       retrieve social media history associated with the user account of the first user from the plurality of databases, wherein the social media history is generated based on the user interactions for the entity extracted from a plurality of social media accounts of the first user or third party data sources;
       determine an affinity for an entity associated with the resource based on analysis of the social media history;
       assign an index value as a function of:
          a time measured of the user interactions for the entity during a time window prior to the resource, and
          the affinity;
       determine if the index value exceeds a threshold; and
       assign the priority flag to the first user based on exceeding the threshold to allow enhanced access for requesting the tickets for the resource.

12. The system according to claim 11, wherein the at least one processor is further configured to:
    determine a time period of streaming content related to the entity; and
    determine the affinity for the entity based on the time period of streaming content related to the entity.

13. The system according to claim 11, wherein the at least one processor is further configured to:
    determine instances of interactions of the first user with images associated with the entity in the plurality of social media accounts, and
    determine the affinity for the entity based on the instances of the interactions of the first user with the images associated with the entity.

14. The system according to claim 11 wherein the at least one processor is further configured to:
    assign the priority flag comprising providing the user account as a priority account, and tag the user account as the priority account enables the first user to have better probability of allocation of the tickets in comparison to a second user having absence of priority account.

15. The system according to claim 11, wherein the at least one processor is further configured to:
   execute analysis of characteristics of the user account to identify the first user as a human or an automated entity; and
   assign the index value based on the analysis of the characteristics of the user account.

16. The system according to claim 11, wherein the user authorization to query the plurality of databases corresponds to reception of password information from the first user to access the plurality of databases.

17. A non-transitory computer-readable medium comprising instructions that are executable by a processing device for causing the processing device to perform operations comprising:
   receiving information of a plurality of databases associated with a user account of a first user, wherein data of user interactions for an entity associated with a resource is stored on the plurality of databases;
   receiving user authorization to query the plurality of databases based on user input on an interface;
   retrieving social media history associated with the user account of the first user from the plurality of databases, wherein the social media history is generated based on the user interactions for the entity extracted from a plurality of social media accounts of the first user or third party data sources;
   determining an affinity for an entity associated with the resource based on analysis of the social media history;
   assigning an index value as a function of:
      a time measured of the user interactions for the entity during a time window prior to the resource, and
      the affinity;
   determining if the index value exceeds a threshold; and
   assigning a priority flag to the first user based on exceeding the threshold to allow enhanced access for requesting tickets for the resource.

18. The non-transitory computer-readable medium according to claim 17, further comprising:
   determining a time period of streaming content related to the entity; and
   determining the affinity for the entity based on the time period of streaming content related to the entity.

19. The non-transitory computer-readable medium according to claim 18, further comprising:
   assigning the priority flag comprising providing the user account as a priority account, and
   tagging the user account as the priority account enables the first user to have better probability of allocation of the tickets in comparison to a second user having absence of priority account.

20. The non-transitory computer-readable medium according to claim 17, further comprising:
   executing analysis of characteristics of the user account to identify the first user as a human or an automated entity; and
   assigning the index value based on the analysis of the characteristics of the user account.

* * * * *